(12) United States Patent
Shimada

(10) Patent No.: US 10,998,748 B2
(45) Date of Patent: May 4, 2021

(54) ELECTRIC POWER SUPPLY SYSTEM AND CONTROL METHOD THEREFOR

(71) Applicant: NISSAN MOTOR CO., LTD., Yokohama (JP)

(72) Inventor: Kazuhide Shimada, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 0 days.

(21) Appl. No.: 16/632,598

(22) PCT Filed: Jul. 31, 2017

(86) PCT No.: PCT/JP2017/027760
§ 371 (c)(1),
(2) Date: Jan. 21, 2020

(87) PCT Pub. No.: WO2019/026149
PCT Pub. Date: Feb. 7, 2019

(65) Prior Publication Data
US 2020/0381935 A1 Dec. 3, 2020

(51) Int. Cl.
*H02J 7/00* (2006.01)
*H01M 10/625* (2014.01)
(Continued)

(52) U.S. Cl.
CPC .......... *H02J 7/007194* (2020.01); *B60L 7/14* (2013.01); *B60L 58/12* (2019.02); *B60L 58/40* (2019.02); *G01R 31/3828* (2019.01); *H01M 8/04268* (2013.01); *H01M 8/04925* (2013.01); *H01M 10/443* (2013.01); *H01M 10/486* (2013.01); *H01M 10/625* (2015.04); *H01M 16/006* (2013.01); *H02J 7/0048* (2020.01);
(Continued)

(58) Field of Classification Search
None
See application file for complete search history.

(56) References Cited

U.S. PATENT DOCUMENTS 10,312,729 B2 * 6/2019 Mitsui ................. H01M 8/0432
10,367,239 B1 * 7/2019 Dao ..................... H01M 2/1077
(Continued)

FOREIGN PATENT DOCUMENTS

JP 2004-281219 A 10/2004
JP 2004-342461 A 12/2004
(Continued)

*Primary Examiner* — Arun C Williams
(74) *Attorney, Agent, or Firm* — Foley & Lardner LLP

(57) ABSTRACT

An electric power supply system 100 comprises a fuel cell system 20 including an FC auxiliary machine 23 that operates to causes fuel cells to generate an electric power, and a battery 10 that generates heat through discharging and charging. The electric power supply system 100 supplies the electric power to an electric load device 90. The electric power supply system 100 determines an operation state of the battery 10, and supplies the electric power discharged from the battery 10 to the FC auxiliary machine 23 of the fuel cell system 20 when it is determined that the battery 10 is a predetermined temperature or less. When it is determined that the battery 10 is in a charging state, the electric power supply system 100 reduces or stops the electric power supplied to the FC auxiliary machine 23.

13 Claims, 10 Drawing Sheets

(51) Int. Cl.
   *G01R 31/3828* (2019.01)
   *B60L 58/12* (2019.01)
   *B60L 58/40* (2019.01)
   *B60L 7/14* (2006.01)
   *H01M 8/04223* (2016.01)
   *H01M 8/04858* (2016.01)
   *H01M 10/44* (2006.01)
   *H01M 10/48* (2006.01)
   *H01M 16/00* (2006.01)

(52) U.S. Cl.
   CPC .......... H02J 7/0063 (2013.01); H02J 7/0068 (2013.01); *B60L 2210/10* (2013.01)

(56) References Cited

U.S. PATENT DOCUMENTS

| | | | | |
|---|---|---|---|---|
| 2002/0014879 A1* | 2/2002 | Koike | .................. | H02J 7/0069 |
| | | | | 320/133 |
| 2003/0118876 A1* | 6/2003 | Sugiura | .................. | B60L 58/34 |
| | | | | 429/9 |
| 2004/0048152 A1* | 3/2004 | Yata | ........................ | H01M 2/30 |
| | | | | 429/162 |
| 2006/0040149 A1 | 2/2006 | Aso et al. | | |
| 2006/0088738 A1* | 4/2006 | Aso | .................. | H01M 8/04007 |
| | | | | 429/9 |
| 2007/0089442 A1* | 4/2007 | Tsuchiya | ............. | H01M 10/625 |
| | | | | 62/186 |
| 2007/0118255 A1* | 5/2007 | Wakashiro | ............ | B60K 6/543 |
| | | | | 701/22 |
| 2007/0218328 A1 | 9/2007 | Osada | | |
| 2007/0264547 A1* | 11/2007 | Ojima | ............... | H01M 8/04686 |
| | | | | 429/431 |
| 2008/0007227 A1* | 1/2008 | Noda | .................... | H02J 7/0086 |
| | | | | 320/160 |
| 2012/0112669 A1* | 5/2012 | Kitanaka | .................. | B60L 9/22 |
| | | | | 318/3 |
| 2012/0274137 A1* | 11/2012 | Yoshida | .................. | B60L 58/30 |
| | | | | 307/43 |
| 2013/0063072 A1 | 3/2013 | Shirasaka et al. | | |
| 2013/0065089 A1 | 3/2013 | Kazuno et al. | | |
| 2013/0154571 A1* | 6/2013 | Hou | ........................ | H02J 7/007 |
| | | | | 320/134 |
| 2014/0084873 A1* | 3/2014 | Sim | ........................ | H02J 7/0091 |
| | | | | 320/134 |
| 2014/0210415 A1* | 7/2014 | Ohmori | ............... | H01M 10/443 |
| | | | | 320/118 |
| 2016/0036100 A1* | 2/2016 | Wang | ................. | H01M 10/0525 |
| | | | | 320/127 |
| 2017/0110975 A1 | 4/2017 | Nishi et al. | | |

FOREIGN PATENT DOCUMENTS

| | | |
|---|---|---|
| JP | 2007-250374 A | 9/2007 |
| JP | 2012-214142 A | 11/2012 |
| JP | 2013-59229 A | 3/2013 |
| JP | 2015-192525 A | 11/2015 |

* cited by examiner

ELECTRIC POWER SUPPLY SYSTEM AND CONTROL METHOD THEREFOR

TECHNICAL FIELD

The present invention relates to an electric power supply system for discharging a battery in accordance with a temperature of the battery and a control method therefor.

BACKGROUND ART

JP 2012-214142 A discloses a technique for increasing temperature of two batteries mounted on a vehicle at a low temperature, by mutually performing charge and discharge of the batteries so that heat is generated within the batteries due to internal resistors of the batteries.

SUMMARY OF INVENTION

In an electric power supply system comprising two batteries as described above, warming-up of the batteries is performed efficiently. However, if either of the batteries is replaced with fuel cells, a problem will raise because it is not possible to mutually perform charge and discharge between the battery and the fuel cells.

In consideration of such a problem, the present invention has an object to provide an electric power supply system with efficiently improved output characteristics of a battery and a control method therefor.

According to an aspect of the present invention, a control method for an electric power supply system that supplies electric power to an electric load is provided. The system comprises a fuel cell system provided with an auxiliary machine that causes fuel cells to generate electric power and a battery that generates heat through discharging and charging. The method comprises a determining step of determining an operation state of the battery, a discharging step of supplying electric power to the auxiliary machine of the fuel cell system by discharging the battery, when the battery is determined to be at a predetermined temperature or less in the determining step, and a charging control step of reducing or stopping the electric power supplied to the auxiliary machine in the discharging step, when the battery is determined to be in a charging state in the determining step.

The details as well as other features and advantages of this invention are set forth in the remainder of the specification and are shown in the accompanying drawings.

DESCRIPTION OF EMBODIMENTS

The embodiments of the present invention will be described with reference to the attached drawings.

First Embodiment

Figure 1:
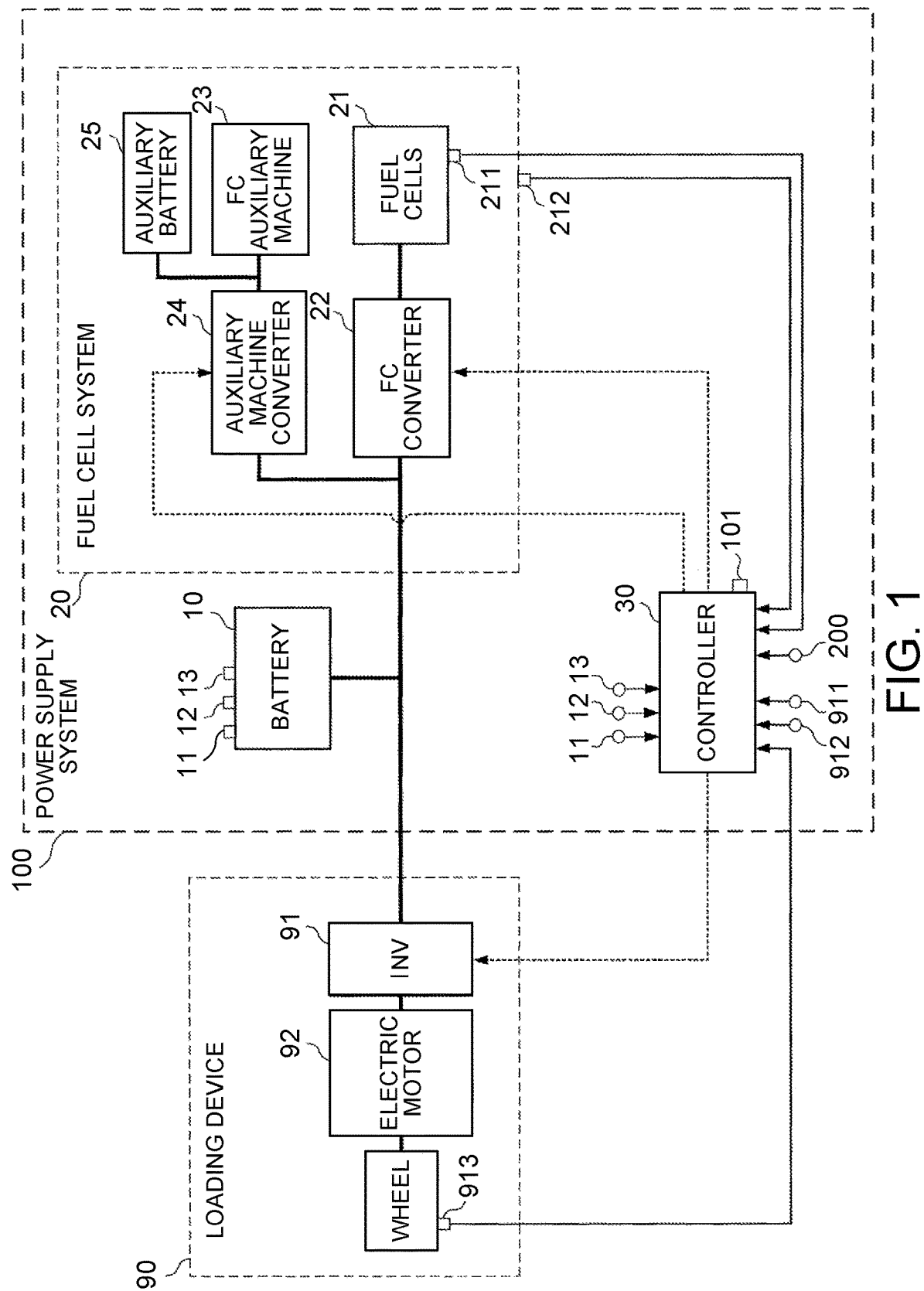
FIG. 1 is a block diagram illustrating a configuration of an electric power supply system according to a first embodiment of the present invention.

FIG. 1 shows an electric power supply system 100 according to a first embodiment of the present invention.

The electric power supply system 100 is configured to supply electric power to an electric load device 90 provided in a movable body such as a vehicle, an airplane, or a vessel, for example.

The electric power supply system 100 according to the present embodiment is provided in a vehicle such as an electric vehicle including a hybrid vehicle or a train. The vehicle is provided with an accelerator sensor 911 that detects an operation amount of an accelerator pedal by a driver of the vehicle, a brake sensor 912 that detects an operation amount of a brake pedal by the driver, and a vehicle speed sensor 913 that detects a running speed of the vehicle.

The electric load device 90 is an operation device that operates by electric power supplied from the electric power supply system 100. The electric load device 90 according to the present embodiment includes an electric motor 92 that drives the vehicle, and an inverter 91 that converts output power of the electric power supply system 100 into alternating-current power and supplies it to the electric motor 92.

The electric power supply system 100 includes a battery 10, a fuel cell system 20, and a controller 30. The electric power supply system 100 is a hybrid power supply system that supplies electric power to the electric load device 90 from at least one of the battery 10 and the fuel cell system 20.

The electric power supply system 100 according to the present embodiment is provided with an FC operation button 200 by which the driver selects start or stop of the fuel cell system 20, and an outside temperature sensor 101 connected to the controller 30 so as to detect an outside ambient temperature.

The battery 10 is mainly used for electric power supply to the electric load device 90. The battery 10 is connected to both the fuel cell system 20 and the electric load device 90. The battery 10 is in the form of a lithium-ion battery, a lead battery, or the like. For example, the battery 10 outputs several hundred volts (V) of direct-current power. The battery 10 is provided with a temperature sensor 11, a current sensor 12, and a voltage sensor 13.

The temperature sensor 11 detects a temperature of the battery 10. The temperature sensor 11 outputs a detection value to the controller 30.

The current sensor 12 detects an output current of the battery 10. The current sensor 12 outputs a detection value to the controller 30.

The voltage sensor 13 detects an output voltage of the battery 10. The voltage sensor 13 outputs a detection value to the controller 30.

The fuel cell system 20 is connected to both the battery 10 and the electric load device 90. The fuel cell system 20 operates such that fuel cells 21 generate electric power. The fuel cell system 20 includes the fuel cells 21, an FC converter 22, an FC auxiliary machine 23, an auxiliary machine converter 24, and an auxiliary battery 25.

The fuel cells 21 are connected to the FC converter 22. The fuel cells 21 generate electric power upon receipt of supply of fuel gas and oxidant gas. The fuel cells 21 may be solid oxide fuel cells, polymer electrolyte fuel cells, or the like. The fuel cells 21 according to the present embodiment are constituted by solid oxide fuel cells.

The fuel cells 21 can supply electric power to at least one of the battery 10 and the inverter 91. The fuel cells 21 are configured such that a plurality of cells is laminated, and the fuel cells 21 output a voltage having a magnitude different from an output voltage of the battery 10.

For example, the fuel cells 21 output a direct-current voltage of dozens of volts that is lower than an output voltage value of the battery 10. In such a configuration, the fuel cells 21 are used as an auxiliary power supply for supplementing the output power of the battery 10. Such an electric power supply system 100 has a function to extend the output range of the battery 10, and therefore, the electric power supply system 100 is called a range extender. The fuel cells 21 are provided with an FC temperature sensor 211, and the fuel cell system 20 is provided with a fuel residual amount sensor 212.

The FC temperature sensor 211 detects a temperature of the fuel cells 21. The FC temperature sensor 211 detects, for example, the temperature of the fuel cells 21, a temperature of oxidant gas supplied to the fuel cells 21, or a temperature of oxidant gas discharged from the fuel cells 21. The FC temperature sensor 211 outputs a detection value to the controller 30.

The fuel residual amount sensor 212 detects a residual amount of fuel supplied to the fuel cells 21. The fuel residual amount sensor 212 outputs a detection value to the controller 30.

The FC converter 22 is a voltage converter placed between the battery 10 and the fuel cells 21. The FC converter 22 converts a voltage value of electric power input from the fuel cells 21 into a different voltage value and outputs it. For example, the FC converter 22 is constituted by a DC/DC converter that boosts or decreases an input primary-side voltage and outputs a secondary-side voltage.

The FC auxiliary machine 23 is connected to the auxiliary machine converter 24. The FC auxiliary machine 23 is an additional apparatus required for power generation of the fuel cells 21. The FC auxiliary machine 23 is, for example, a heater for warming the fuel cells 21, an actuator for supplying oxidant gas or fuel gas to the fuel cells 21, an actuator for circulating refrigerant to the fuel cells 21, or the like.

One example of the actuator constituting the FC auxiliary machine 23 is a blower or a compressor for supplying air from atmosphere to the fuel cells 21 as oxidant gas. The FC auxiliary machine 23 according to the present embodiment is constituted by a compressor for supplying oxidant gas to the fuel cells 21.

The auxiliary machine converter 24 is a voltage translator placed between the battery 10 and the FC auxiliary machine 23. The auxiliary machine converter 24 supplies output power from at least one of the battery 10 and the fuel cells 21 to the FC auxiliary machine 23. For example, the auxiliary machine converter 24 is constituted by a DC/DC converter for converting a voltage between the FC converter 22 and the battery 10 to a voltage value within an operating voltage range of the FC auxiliary machine 23.

The auxiliary battery 25 is placed between the auxiliary machine converter 24 and the FC auxiliary machine 23. The auxiliary battery 25 supplies electric power to the FC auxiliary machine 23. For example, the auxiliary battery 25 supplies electric power to the FC auxiliary machine 23 when electric power cannot be supplied from any of the battery 10 and the fuel cells 21. The auxiliary battery 25 is constituted by a lead battery of several dozen volts, for example.

The controller 30 is constituted by one or more microcomputers including a central processing unit (CPU) in which a predetermined process is programmed and a storage device. The controller 30 is a control device that controls the operation of the electric power supply system 100.

The controller 30 acquires detection values output from the temperature sensor 11, the current sensor 12, the voltage sensor 13, the FC temperature sensor 211, the fuel residual amount sensor 212, the accelerator sensor 911, the brake sensor 912, and the vehicle speed sensor 913. The controller 30 controls respective operations of the FC converter 22, the auxiliary machine converter 24, and the inverter 91 in accordance with the detection values thus acquired.

For example, the controller 30 acquires a required torque of the electric motor 92 by use of the detection value of the accelerator sensor 911 and calculates required power required to the electric power supply system 100 based on the required torque. The controller 30 controls the FC converter 22, the auxiliary machine converter 24, and the inverter 91 so that the required power thus calculated is supplied to the electric motor 92 from at least either one of the battery 10 and the fuel cells 21.

Further, the controller 30 calculates a charging amount of the battery 10 by use of the detection value of at least either one of the current sensor 12 and the voltage sensor 13 and starts to operate the fuel cell system 20 based on the magnitude of the charging amount.

The controller 30 of the present embodiment calculates, as the charging amount of the battery 10, a state of charge (SOC) found from a general calculation technique such as current accumulation or voltage accumulation of the battery 10 based on the detection values of the current sensor 12 and the voltage sensor 13.

When the calculated SOC of the battery 10 is equal to or less than a predetermined FC start threshold, the controller 30 controls the FC converter 22, the FC auxiliary machine 23, and the auxiliary machine converter 24 such that the fuel cell system 20 starts to operate.

In the meantime, when the battery SOC exceeds a predetermined FC stop threshold, the controller 30 stops operation of the fuel cell system 20. The FC stop threshold as used herein may be set to the same value as the aforementioned FC start threshold or may be set to a value different from the FC start threshold, e.g., a value larger or smaller than the FC start threshold.

Further, when the controller 30 receives a start operation signal to instruct operation start of the fuel cell system 20 from the FC operation button 200 at the time when the driver gets in a vehicle or while the driver is driving the vehicle, the controller 30 executes a starting process of the fuel cell system 20. The controller 30 controls operation of the auxiliary machine converter 24 such that electric power discharged from the battery 10 is supplied to the FC auxiliary machine 23.

Figure 2:
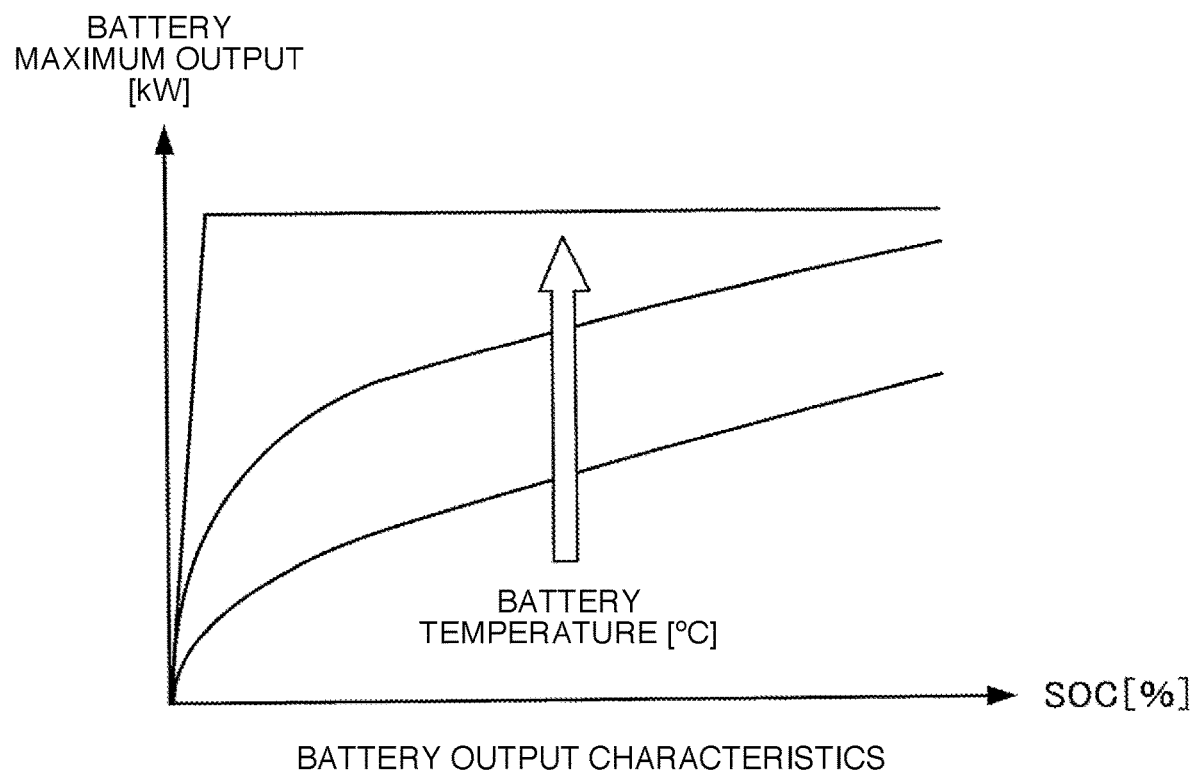
FIG. 2 is a diagram illustrating a relationship between a temperature of a battery and output characteristics of the battery.

FIG. 2 is a diagram illustrating a relationship between a maximum output of the battery 10 and the SOC of the battery 10 depending on the temperature of the battery 10. The maximum output of the battery 10 is a maximum value of discharge power of the battery 10.

As illustrated in FIG. 2, as the temperature of the battery 10 decreases, the output characteristics of the battery 10 decrease. For example, when the vehicle is started under a temperature environment below the freezing point, the temperature of the battery 10 is low, so that the output characteristics of the battery 10 worsen. Accordingly, when the temperature of the battery 10 is low, it is difficult to obtain the required power necessary for driving of the electric load device 90 from the battery 10. It is therefore necessary to perform warming-up of the battery 10 at an early stage.

Figure 3:
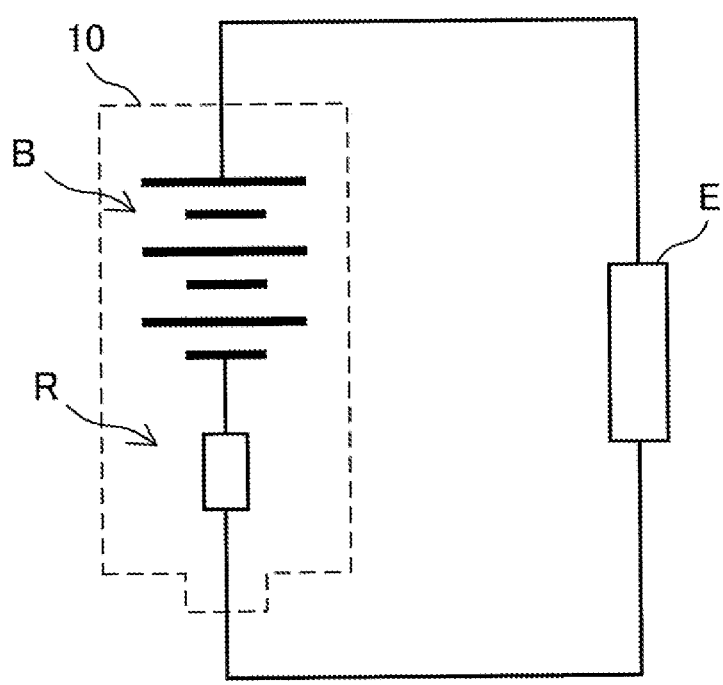
FIG. 3 is a diagram describing self-heating of the battery.

FIG. 3 is a circuit diagram to describe an equivalent circuit of the battery 10.

As illustrated in FIG. 3, the battery 10 has an internal resistor R associated with a battery body B. Accordingly, when the battery 10 discharges to an external device E, a discharge current flows through the internal resistor R. As a result, the internal resistor R generates heat, thereby heating the battery 10. Similarly, in a case where the battery 10 is charged, a charge current flows through the internal resistor R. Accordingly, the internal resistor R generates heat, thereby heating the battery 10.

In a case where the temperature of the battery 10 is below a rated output temperature necessary to secure a rated output of the battery 10, the warming-up of the battery 10 is promoted by way of charging or discharging the battery 10.

Figure 4:
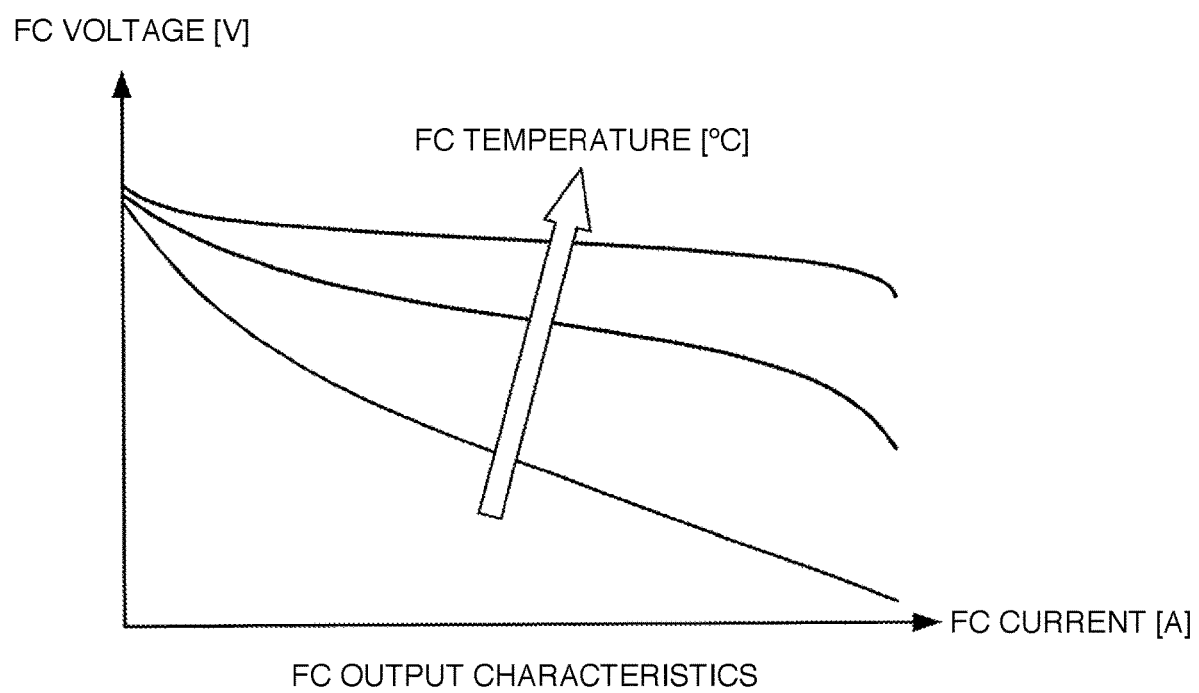
FIG. 4 is a diagram illustrating a relationship between a temperature of a fuel cell and output characteristics of the fuel cell.

FIG. 4 is a diagram illustrating a relationship between output characteristics of the voltage and the current of the fuel cells 21 depending on the temperature of the fuel cells 21.

As illustrated in FIG. 4, as the temperature of the fuel cells 21 decreases, the output characteristics of the fuel cells 21 worsen, similarly to the output characteristics of the battery 10. Particularly, in terms of the solid oxide fuel cells, a warming-up process of increasing the temperature of the fuel cells 21 to an operating temperature of several hundred degrees Centigrade is required. Accordingly, a longer time is required to complete the warming-up of the fuel cells 21 constituted by the solid oxide fuel cells.

In the warming-up process, for example, the controller 30 drives a compressor constituting the FC auxiliary machine 23 so that oxidant gas discharged from the compressor is heated by a combustor, a heater, or the like (not shown) and then supplied to the fuel cells 21. In order to improve a response of the fuel cells 21, it is preferable to start the fuel cell system 20 at an early stage.

Figure 5:
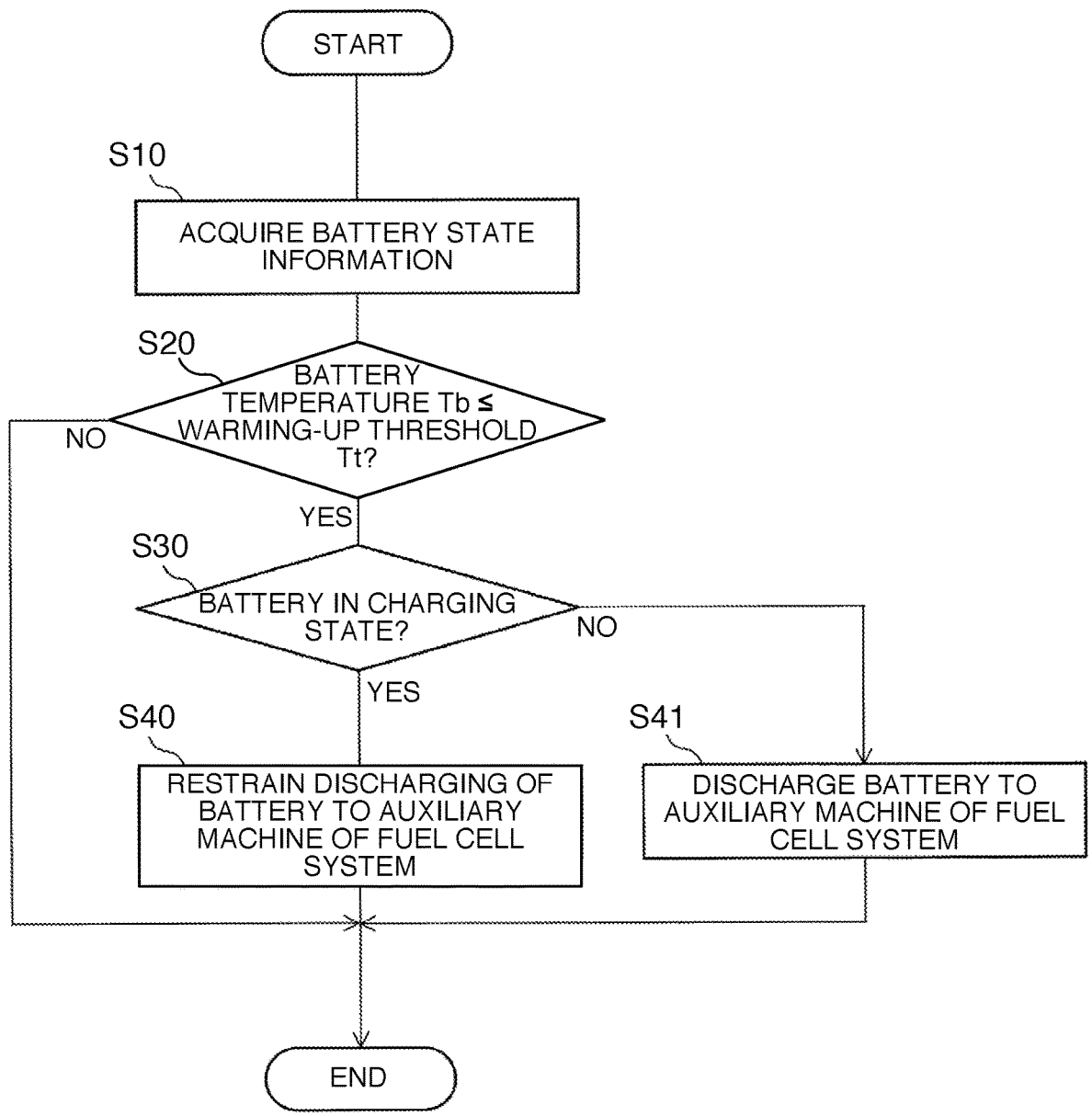
FIG. 5 is a flowchart illustrating a control process of an electric power supply system according to a first embodiment of the present invention.

FIG. 5 is a flowchart illustrating a process of controlling the electric power supply system 100 performed by the controller 30 according to the present embodiment.

In a step S10, the controller 30 acquires battery state information to specify an operation state such as a temperature condition of the battery 10 and an input/output power state of the battery 10.

The battery state information includes a temperature specification parameter (temperature information) to determine a temperature Tb of the battery 10, and a charge specification parameter to specify a charging state of the battery 10. The battery state information finally includes the temperature Tb of the battery 10 determined by the temperature specification parameter, and an information as to whether or not the battery 10 is in the charging state determined by the charge specification parameter.

As one example of the temperature specification parameter, the controller 30 acquires the detection value of the temperature sensor 11.

Alternatively, an output characteristic map indicative of the relationship between the output characteristics of the battery 10 and the temperature of the battery 10, as illustrated in FIG. 4, is stored in advance, and when a relationship between a voltage and a current of the battery 10 is found, the temperature Tb of the battery 10 can be estimated therefrom. In this context, the controller 30 may acquire respective detection values from the current sensor 12 and the voltage sensor 13 as the temperature specification parameter.

Alternatively, a heat generation amount map indicative of a relationship between a charging/discharging amount of the battery 10 and a heat generation amount of the battery 10 may be stored in the controller 30. If a detection value of the outside temperature sensor 101 at the time of starting of the battery 10 is considered as the temperature Tb of the battery 10, the temperature Tb of the battery 10 can be estimated.

The controller 30 may acquire the detection value of the outside temperature sensor 101 at the time of starting the battery 10 and respective detection values of the current sensor 12 and the voltage sensor 13 after the starting of the battery 10 as the temperature specification parameter. Instead of the respective detection values of the current sensor 12 and the voltage sensor 13, a variation in the state of charge (SOC) of the battery 10 after the starting may be used.

In the meantime, as one of the charge specification parameters, the controller 30 acquires the detection value of the current sensor 12. When the detection value of the current sensor 12 indicates a positive value, the controller 30 determines that the battery 10 is in a discharging state, and when the detection value of the current sensor 12 indicates a negative value, the controller 30 determines that the battery 10 is in the charging state.

Alternatively, when the electric motor 92 is in a regeneration state, it can be estimated that the battery 10 is in the charging state, and therefore, the controller 30 may acquire a torque command value of the electric motor 92 as the charge specification parameter. In this case, when the torque command value is a positive value, the controller 30 determines that the electric motor 92 is in a driving state, and when the torque command value is a negative value, the controller 30 determines that the electric motor 92 is in the regeneration state.

Alternatively, charge power of the battery 10 and power consumption of the fuel cell system 20 are obtained, and the charge power of the battery 10 is compared with the power consumption of the fuel cell system 20, it can be estimated whether or not the battery 10 is in the charging state. For this purpose, the controller 30 may acquire respective detection values of the current sensor 12 and the voltage sensor 13 and a target value of generated power of the fuel cells 21 as the charge specification parameter.

In steps S20 and S30, the controller 30 determines an operation state of the battery 10 based on the above battery state information.

In the step S20, the controller 30 determines whether or not the temperature Tb of the battery 10 that is determined by the temperature specification parameter in the battery state information is equal to or less than a warming-up threshold Tt. The warming-up threshold Tt is, for example, a value determined in advance based on the temperature of the battery 10 at which a minimum electric power necessary for driving of the electric motor 92 can be supplied from the battery 10.

For example, in a case where the aforementioned output characteristic map is stored in the controller 30, the controller 30 acquires respective detection values of the current sensor 12 and the voltage sensor 13 as the temperature specification parameter and calculates discharge power of the battery 10 by use of the detection values thus acquired. When the controller 30 calculates the discharge power of the battery 10, the controller 30 refers to the output characteristic map and calculates a temperature associated with the discharge power as a temperature Tb of the battery 10.

Thus, the controller 30 determines, based on the temperature specification parameter, whether or not the battery 10 is equal to or less than the warming-up threshold Tt. When it is determined that the temperature Tb of the battery 10 exceeds the warming-up threshold Tt, the controller 30 terminates the control process of the electric power supply system 100.

When it is determined that the temperature Tb of the battery 10 is equal to or less than the warming-up threshold Tt, the controller 30 determines, based on the charge specification parameter in the battery state information, whether or not the input/output power state of the battery 10 is the charging state in the step S30.

For example, in a case where the torque command value of the electric motor 92 is used as the charge specification parameter, the controller 30 determines, based on a sign of the torque command value, whether the battery 10 is in the charging state or not. When the torque command value is a positive value, the electric motor 92 is in the driving state, so that the controller 30 determines that the battery 10 is not in the charging state. In the meantime, when the torque command value is a negative value, the electric motor 92 is in the regeneration state, so that the controller 30 determines that the battery 10 is in the charging state.

When it is determined that the battery 10 is not in the charging state, the controller 30 controls an operation of the auxiliary machine converter 24 such that the battery 10 discharges electric power to the FC auxiliary machine 23 in a step S41. That is, the controller 30 controls the auxiliary machine converter 24 so as to outputs operation power necessary for the operation of the FC auxiliary machine 23 from the auxiliary machine converter 24 using the discharge power of the battery 10.

At this time, when the fuel cell system 20 is in a stop state, the controller 30 starts the fuel cell system 20 by causing the battery 10 to discharge electric power to the FC auxiliary machine 23. Since the fuel cells 21 of the present embodiment are solid oxide fuel cells, the controller 30 executes a warming-up process of increasing the temperature of the fuel cells 21 to several hundred degrees Centigrade in the starting process of the fuel cell system 20.

In contrast, when the fuel cell system 20 has already started, the generated power of the fuel cells 21 may be supplied to the FC auxiliary machine 23. In such a case, the controller 30 controls the operations of the FC converter 22 and the auxiliary machine converter 24 such that supply electric power to the FC auxiliary machine 23 is switched from the generated power of the fuel cells 21 to the discharge power of the battery 10.

When it is determined that the battery 10 is in the charging state, the controller 30 controls the operation of the auxiliary machine converter 24 such that the discharging of electric power of the battery 10 to the FC auxiliary machine 23 is restrained in a step S40.

For example, in order to restrain the discharging of electric power of the battery 10, the controller 30 controls the auxiliary machine converter 24 such that the output power from the battery 10 to the FC auxiliary machine 23 is reduced to a predetermined power value that is smaller than the operation power of the FC auxiliary machine 23. Alternatively, the controller 30 stops the output of the electric power from the auxiliary machine converter 24 to the FC auxiliary machine 23.

More specifically, the controller 30 boosts up an output-side voltage value of the auxiliary machine converter 24 to be higher than a voltage value of the operation power that should be supplied to the FC auxiliary machine 23. At this time, since the auxiliary battery 25 is connected between the FC auxiliary machine 23 and the auxiliary machine converter 24, electric power corresponding to the reduced output power of the auxiliary machine converter 24 is supplied from the auxiliary battery 25 to the FC auxiliary machine 23.

When the process of the step S40 or S41 is finished, a series of the control process of the electric power supply system 100 is terminated.

As described above, when the temperature Tb of the battery 10 determined by the temperature specification parameter is equal to or less than the predetermined warming-up threshold Tt, the controller 30 determines, based on the charge specification parameter, whether the battery 10 is in the charging state or not. When it is determined that the battery 10 is in the charging state, the controller 30 reduces or stops the electric power supplied from the battery 10 to the FC auxiliary machine 23.

When it is determined that the battery 10 is not in the charging state, the controller 30 adjusts the output power output from the auxiliary machine converter 24 to the FC auxiliary machine 23 to the operation power by which the FC auxiliary machine 23 operates. Furthermore, when it is determined that the battery 10 is in the charging state, the controller 30 sets the output power of the auxiliary machine converter 24 to a value smaller than the operation power.

In FIG. 5, the process of the step S30 is executed after the process of the step S20 is executed, but the processes of the steps S20 and S30 may be executed in parallel.

Figure 6:
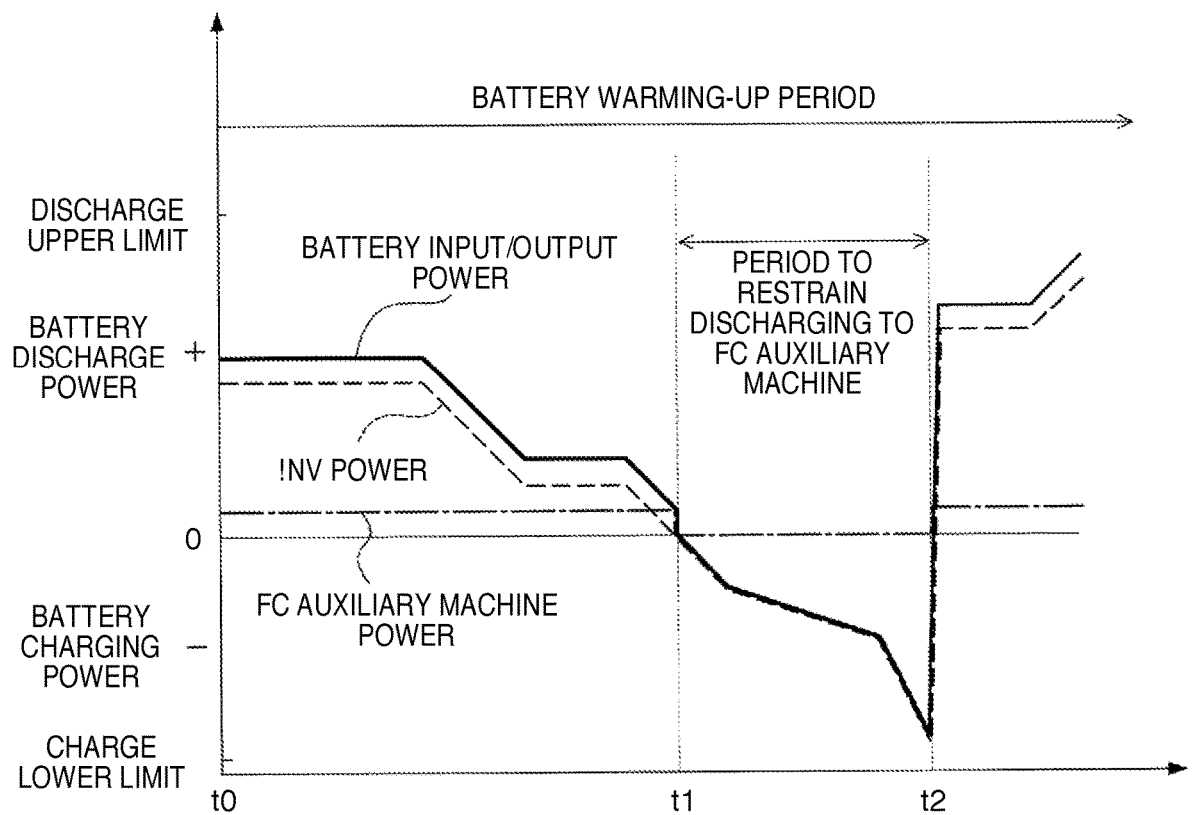
FIG. 6 is a timing chart illustrating a result of controlling charging and discharging of a battery connected to a fuel cell system.

FIG. 6 is a timing chart illustrating a result of controlling charging and discharging of the battery 10 and operation of the fuel cell system 20 when the temperature Tb of the battery 10 is lower than the warming-up threshold Tt.

Here, the horizontal axis indicates time, and the vertical axis indicates charge power and discharge power of the battery 10. As an absolute value of the charge power or the discharge power of the battery 10 increases, a self-heating amount of the battery 10 increases, thereby promoting the warming-up of the battery 10.

INV power indicates positive driving power from the battery 10 to the inverter 91 and negative regenerative power from the electric motor 92 to the inverter 91, and FC auxiliary machine power indicates power discharged to the FC auxiliary machine 23 from the battery 10 through the auxiliary machine converter 24. Battery input/output power indicates a total variation of the charge power and the discharge power in the battery 10.

Before a time t0, the controller 30 determines that the temperature Tb of the battery 10 is lower than the warming-up threshold Tt, and the controller 30 executes the starting process of the fuel cell system 20. Since the fuel cells 21 of the present embodiment are solid oxide fuel cells, the starting process of the fuel cell system 20 includes the warming-up process of increasing the temperature of the fuel cells 21 to a temperature suitable for power generation.

When the driver depresses the accelerator pedal to accelerate the vehicle, the controller 30 supplies electric power to the electric motor 92 from the battery 10 through the inverter 91.

At the time t0, the temperature Tb of the battery 10 is still lower than the warming-up threshold Tt. Accordingly, while the controller 30 controls the FC converter 22 and supplies electric power to the inverter 91 from the battery 10, the controller 30 controls the auxiliary machine converter 24 such that the battery 10 discharges electric power to the FC auxiliary machine 23.

Since the battery 10 supplies electric power to the FC auxiliary machine 23 in addition to power supply to the inverter 91, a discharge current of the battery 10 increases and the warming-up of the battery 10 is promoted. Further, since the discharge power of the battery 10 is supplied to the FC auxiliary machine 23, the electric power used in the starting process of the fuel cell system 20 is partially covered by the battery 10.

As a result, the electric power supply system 100 can improve the output characteristics of the battery 10 at an early stage and can execute the warming-up process of the fuel cell system 20 efficiently.

At a time t1, the driver releases a foot from the accelerator pedal to decelerate the vehicle, so that the battery 10 is charged with regenerative power from the electric motor 92 through the inverter 91. Accordingly, the INV power is changed from a positive value to a negative value.

At this time, since the sign of the torque command value of the electric motor 92 is changed from positive to negative, the controller 30 determines that the battery 10 is in the charging state. Then, the controller 30 stops the electric power supplied to the FC auxiliary machine 23 from the battery 10 through the auxiliary machine converter 24. As a result, the electric power supplied to the FC auxiliary machine 23 becomes zero.

By stopping the electric power supply from the battery 10 to the FC auxiliary machine 23 when the battery 10 is shifted to the charging state, it is possible to restrain a decrease in the charge current flowing through the internal resistor R of the battery 10. Accordingly, the charging amount of the battery 10 is increased such that a decrease in the self-heating amount of the battery 10 is restrained.

As a result, the warming-up of the battery 10 is performed efficiently during the charging of the battery 10 in addition to that the warming-up of the battery 10 is promoted during the discharging of the battery 10.

At a time t2, the driver depresses the accelerator pedal to accelerate the vehicle again, so that the battery 10 discharge electric power to the FC auxiliary machine 23 in addition to the power supply to the inverter 91. Accordingly, the discharge current of the battery 10 increases, and the self-heating amount increases, so that the warming-up of the battery 10 is promoted.

As described, in a state where the temperature Tb of the battery 10 is lower than the warming-up threshold Tt, the battery 10 discharges electric power to the FC auxiliary machine 23 until the battery 10 is shifted to the charging state, so that the output characteristics of the battery 10 can be improved efficiently.

According to the first embodiment of the present invention, the electric power supply system 100 includes the fuel cell system 20 including the FC auxiliary machine 23 that operates such that the fuel cells 21 generate electric power, and the battery 10 that generates heat by discharging and charging, and the electric power supply system 100 supplies electric power to the electric load device 90.

The control method for the electric power supply system 100 includes the steps S20 and S30 of determining the operation state of the battery 10, and the step S41 of supplying electric power to the FC auxiliary machine 23 by discharging the battery 10 when it is determined that the battery 10 is equal to or less than a predetermined temperature in the step S20. The control method for the electric power supply system 100 includes the step S40 of reducing or stopping the electric power supplied in the step S41 to the FC auxiliary machine 23, when it is determined that the battery 10 is in the charging state in step S30.

As illustrated in FIG. 2 and FIG. 4, when the battery 10 is at the predetermined temperature or less, not only the output characteristics of the battery 10 but also the output characteristics of the fuel cell system 20 might decrease.

To cope with this situation, according to the present embodiment, the battery 10 is discharged to the FC auxiliary machine 23 until the battery 10 is shifted to the charging state, so that the discharge current flowing through the internal resistor R of the battery 10 increases, thereby making it possible to promote the warming-up of the battery 10. Further, since the discharge power from the battery 10 is effectively used in the warming-up process of the fuel cell system 20, consumption of the generated power of the fuel cells 21, the electric power of the auxiliary battery 25 can be reduced just by the amount of the electric power discharged from the battery 10. Accordingly, while the warming-up of both the battery 10 and the fuel cells 21 is promoted, it is possible to restrain an increase in energy loss in the fuel cell system 20.

Further, according to the present embodiment, when the battery 10 is shifted to the charging state, the electric power supplied from the battery 10 to the FC auxiliary machine 23 is reduced or stopped. This restrains a decrease in the charge power of the battery 10, so that it is possible to restrain wasteful discharge from the battery 10 to the FC auxiliary machine 23 and to restrain a decrease in the self-heating amount of the battery 10.

Accordingly, it is possible to restrain a decrease in temperature increase effect of the battery 10 by discharging and to improve the output characteristics of the electric power supply system 100 at an early stage. In other words, the output characteristics of the battery 10 can be improved efficiently.

Further, according to the present embodiment, the electric power supply system 100 further includes the auxiliary battery 25 connected to the FC auxiliary machine 23. As described in the step S40 in FIG. 5, when it is determined that the battery 10 is in the charging state, the controller 30 causes the auxiliary battery 25 to supply electric power to the FC auxiliary machine 23 so that the FC auxiliary machine 23 operates.

Accordingly, it is possible to avoid insufficiency of the electric power to the FC auxiliary machine 23 when the electric power supplied from the battery 10 to the FC auxiliary machine 23 is restrained. This makes it possible to prevent an improvement degree of the output characteristics of the fuel cells 21 from decreasing that may caused by a decrease in a drive power of the FC auxiliary machine 23.

Particularly according to the present embodiment, the electric power supply system 100 further includes the auxiliary machine converter 24 placed between the battery 10 and the FC auxiliary machine 23. The auxiliary machine converter 24 decreases the voltage of the FC auxiliary machine 23 from the voltage of the battery 10. When it is determined that the battery 10 is in the charging state, the controller 30 reduces or stops the output power output from the auxiliary machine converter 24 to the FC auxiliary machine 23.

When the controller 30 controls the output power of the auxiliary machine converter 24 as such, it is possible to reduce the electric power supplied from the battery 10 to the FC auxiliary machine 23. Further, the auxiliary battery 25 is directly connected to the FC auxiliary machine 23 as illustrated in FIG. 1, and no power loss is caused in the auxiliary machine converter 24, so that the electric power can be supplied to the FC auxiliary machine 23 efficiently.

Further, when it is determined that the battery 10 is in the charging state, the controller 30 of the present embodiment controls the FC converter 22 and the auxiliary machine converter 24 such that the electric power is supplied from the fuel cells 21 to the FC auxiliary machine 23. Accordingly, while the electric power supply from the battery 10 to the FC auxiliary machine 23 is restrained, the FC auxiliary machine 23 can operate.

When the controller 30 supplies the generated power of the fuel cells 21 to the FC auxiliary machine 23 as such, the FC auxiliary machine 23 is not stopped, so that the warming-up of the fuel cells 21 can be continued while the battery 10 is warmed up efficiently. Accordingly, it is possible to finish the warming-up of both the battery 10 and the fuel cells 21 at an early stage.

Alternatively, when it is determined that the battery 10 is in the charging state, the controller 30 may supply electric power to the FC auxiliary machine 23 from the battery 10 so that the FC auxiliary machine 23 operates.

For example, in a case where the SOC of the battery 10 is lower than the aforementioned FC start threshold, it is necessary to start the fuel cell system 20, so the controller 30 supplies electric power to the FC auxiliary machine 23 from the battery 10. Alternatively, in a case where the SOC of the battery 10 might be overcharged, or in a case where the temperature of the fuel cells 21 reaches a normal operation threshold in several seconds, the controller 30 supplies electric power to the FC auxiliary machine 23 from the battery 10.

As such, in a case where the warming-up of the fuel cells 21 should be prioritized over the warming-up of the battery 10, the controller 30 supplies electric power to the FC auxiliary machine 23 from the battery 10 without restraining the discharging of the battery 10. Accordingly, it is possible to continuously supply electric power to the electric load device 90 from the electric power supply system 100.

Further, according to the present embodiment, the electric load device 90 includes the electric motor 92 having the driving state and the regeneration state. As described in the steps S10 and S30 in FIG. 5, when the electric motor 92 is shifted to the regeneration state, the controller 30 determines that the battery 10 is in the charging state. For example, the controller 30 determines whether the electric motor 92 is shifted to the regeneration state or not, based on the sign of the torque command value of the electric motor 92 or the sign of the current value of the electric motor 92. When the controller 30 detects or estimates the operation state of the electric motor 92 as such, it is possible to determine whether the battery 10 is in the charging state or not.

Further, as described in the step S10, in a case where the current of the battery 10 is detected by use of the current sensor 12, the controller 30 may determine that the battery 10 is in the charging state when the value of the detected current indicates a charge current. According to the present embodiment, the charge current to be charged to the battery 10 shows a negative value.

Thus, the controller 30 can precisely determine the operation state of the battery 10 by use of the current sensor 12. Accordingly, it is possible to shorten a period during which the discharging of the battery 10 to the FC auxiliary machine 23 continues even though the battery 10 is shifted from the discharging state to the charging state.

Further, according to the present embodiment, the fuel cells 21 are constituted by solid oxide fuel cells, and as described in the step S41 in FIG. 5, when the fuel cell system 20 is started, the controller 30 performs warming-up of the solid oxide fuel cell.

It is necessary for the solid oxide fuel cell to increase its temperature to several hundred degrees Centigrade. Therefore, it takes a specific time, e.g., dozens of minutes, to finish the warming-up of the solid oxide fuel cell. By use of the solid oxide fuel cell as such, it takes time to warm up the fuel cells 21, so that the response of the fuel cells 21 decreases. By promoting the warming-up of the battery 10 even when the battery 10 is in the charging state, it is possible to improve the response of the electric power supply system 100.

The controller 30 finishes the warming-up of the fuel cells 21 when the fuel cells 21 reach a particular temperature, e.g., 600° C. or more. Thereafter, when the battery 10 is shifted to the charging state, the battery 10 can be charged with generated power from the fuel cells 21 through the FC converter 22, so that the charge power of the battery 10 increases, thereby making it possible to promote the warming-up of the battery 10.

Second Embodiment

Figure 7:
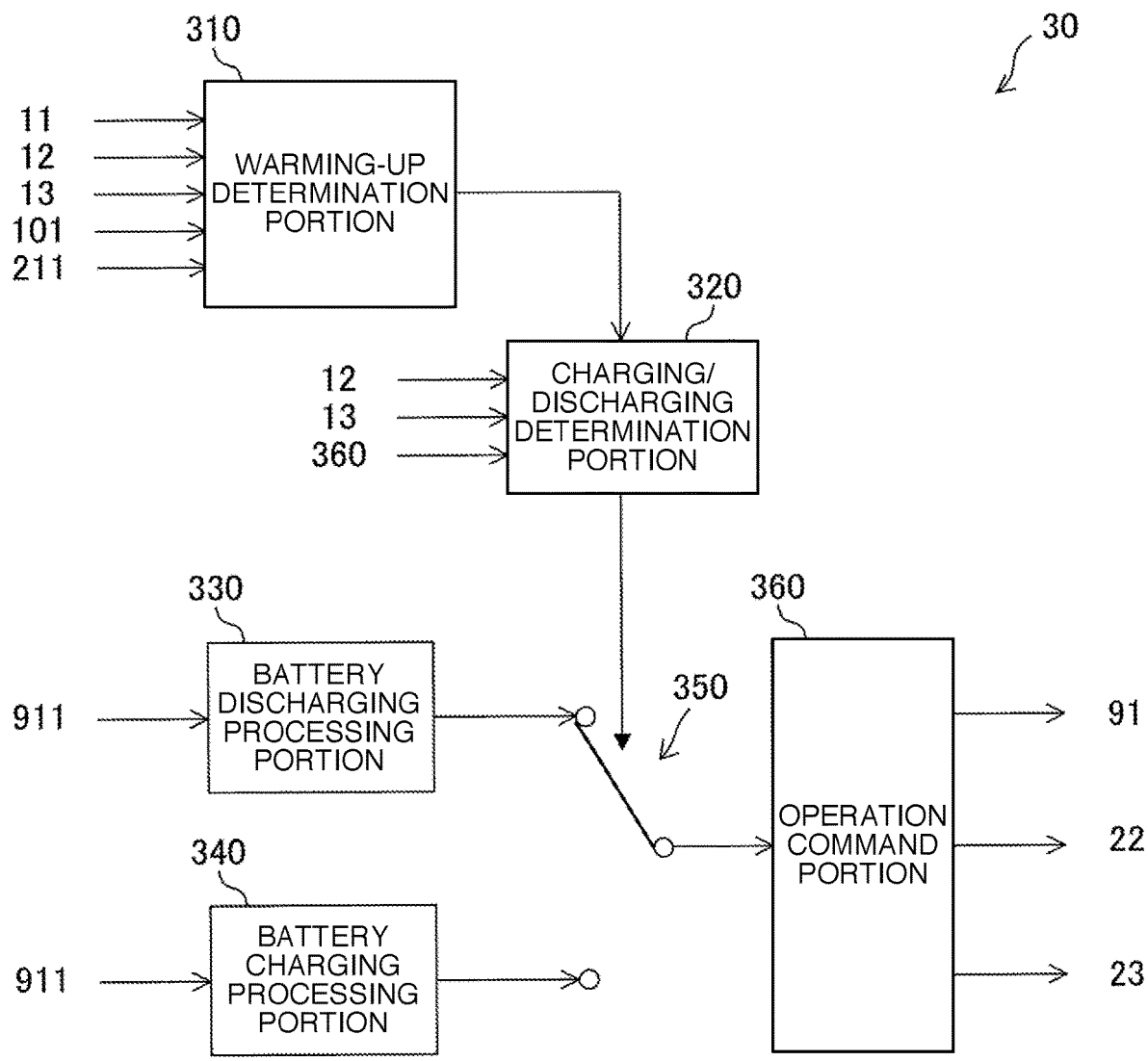
FIG. 7 is a block diagram illustrating a configuration of a controller configured to control the electric power supply system, according to a second embodiment of the present invention.

FIG. 7 is a block diagram illustrating an example of a main functional configuration of the controller 30 according to the second embodiment of the present invention.

The controller 30 includes a warming-up determination portion 310, a charging/discharging determination portion 320, a battery discharging processing portion 330, a battery charging processing portion 340, a process switching portion 350, and an operation command portion 360.

The warming-up determination portion 310 determines a temperature state of the battery 10. As described in the step S20 in FIG. 5, the warming-up determination portion 310 determines whether or not the temperature Tb of the battery 10 is equal to or less than the warming-up threshold Tt, by use of the temperature specification parameter of the battery 10.

The temperature specification parameter of the battery 10 includes, for example, a detection value of the temperature sensor 11, respective detection values from the current sensor 12 and the voltage sensor 13, and the like. When the electric power supply system 100 is started, a detection value of the FC temperature sensor 211 or a detection value of the outside temperature sensor may be used as the temperature specification parameter of the battery 10.

When the temperature Tb of the battery 10 is equal to or less than the warming-up threshold Tt, the warming-up determination portion 310 outputs, to the charging/discharging determination portion 320, a warming-up command signal indicating that the warming-up of the battery 10 is required. In the meantime, when the temperature Tb of the battery 10 exceeds the warming-up threshold Tt, the warming-up determination portion 310 outputs, to the charging/discharging determination portion 320, a normal command signal indicating that the warming-up of the battery 10 is not required.

Upon receipt of the warming-up command signal from the warming-up determination portion 310, the charging/discharging determination portion 320 determines a power state of the battery 10. As described in the step S30 in FIG. 5, the charging/discharging determination portion 320 determines whether or not the power state of the battery 10 is in the charging state, by use of the charge specification parameter of the battery 10.

The charge specification parameter of the battery 10 includes, for example, the detection value of at least either one of the current sensor 12 and the voltage sensor 13, a torque command value output from the operation command portion 360 to the inverter 91, or the like. Note that the charging/discharging determination portion 320 may have hysteresis so that a determination result does not change frequently in a short time.

When it is determined that the battery 10 is in the charging state, the charging/discharging determination portion 320 outputs a charge control signal indicative of the charging of the battery 10 to the process switching portion 350. In the meantime, when it is determined that the battery 10 is not in the charging state, the charging/discharging determination portion 320 outputs a discharge control signal indicative of the discharging of the battery 10 to the process switching portion 350.

The battery discharging processing portion 330 controls the auxiliary machine converter 24 such that the battery 10 is discharged to the FC auxiliary machine 23. More specifically, based on a detection value from the accelerator sensor 911, the battery discharging processing portion 330 calculates a torque command value indicative of a regeneration force and a driving force of the electric motor 92, a power generation command value indicative of generated power of the fuel cells 21, and an auxiliary-machine operation command value to drive the FC auxiliary machine 23.

The FC auxiliary machine 23 of the present embodiment is a compressor that supplies oxidant gas to the fuel cells 21, and therefore, the battery charging processing portion 340 calculates a torque command value of a drive motor provided in the compressor as the aforementioned auxiliary-machine operation command value. The battery discharging processing portion 330 outputs the calculated torque command value of the electric motor 92, the calculated power generation command value of the fuel cells 21, and the calculated auxiliary-machine operation command value of the FC auxiliary machine 23 to the process switching portion 350.

The battery charging processing portion 340 controls the auxiliary machine converter 24 such that electric power to be supplied to the FC auxiliary machine 23 is restrained. More specifically, based on the detection value from the accelerator sensor 911, the battery charging processing portion 340 calculates the torque command value of the electric motor 92, the power generation command value of the fuel cells 21, and the auxiliary-machine operation command value of the FC auxiliary machine 23. The battery discharging processing portion 330 outputs the calculation results to the process switching portion 350.

Upon receipt of the discharge control signal from the charging/discharging determination portion 320, the process switching portion 350 outputs the calculation results of the battery discharging processing portion 330 to the operation command portion 360. In the meantime, upon receipt of the charge control signal from the charging/discharging determination portion 320, the process switching portion 350 outputs the calculation results of the battery charging processing portion 340 to the operation command portion 360.

The operation command portion 360 supplies the torque command value of the electric motor 92 to the inverter 91, supplies the power generation command value of the fuel cells 21 to the FC converter 22, and supplies the operation command value of the FC auxiliary machine 23 to the auxiliary machine converter 24.

Figure 8:
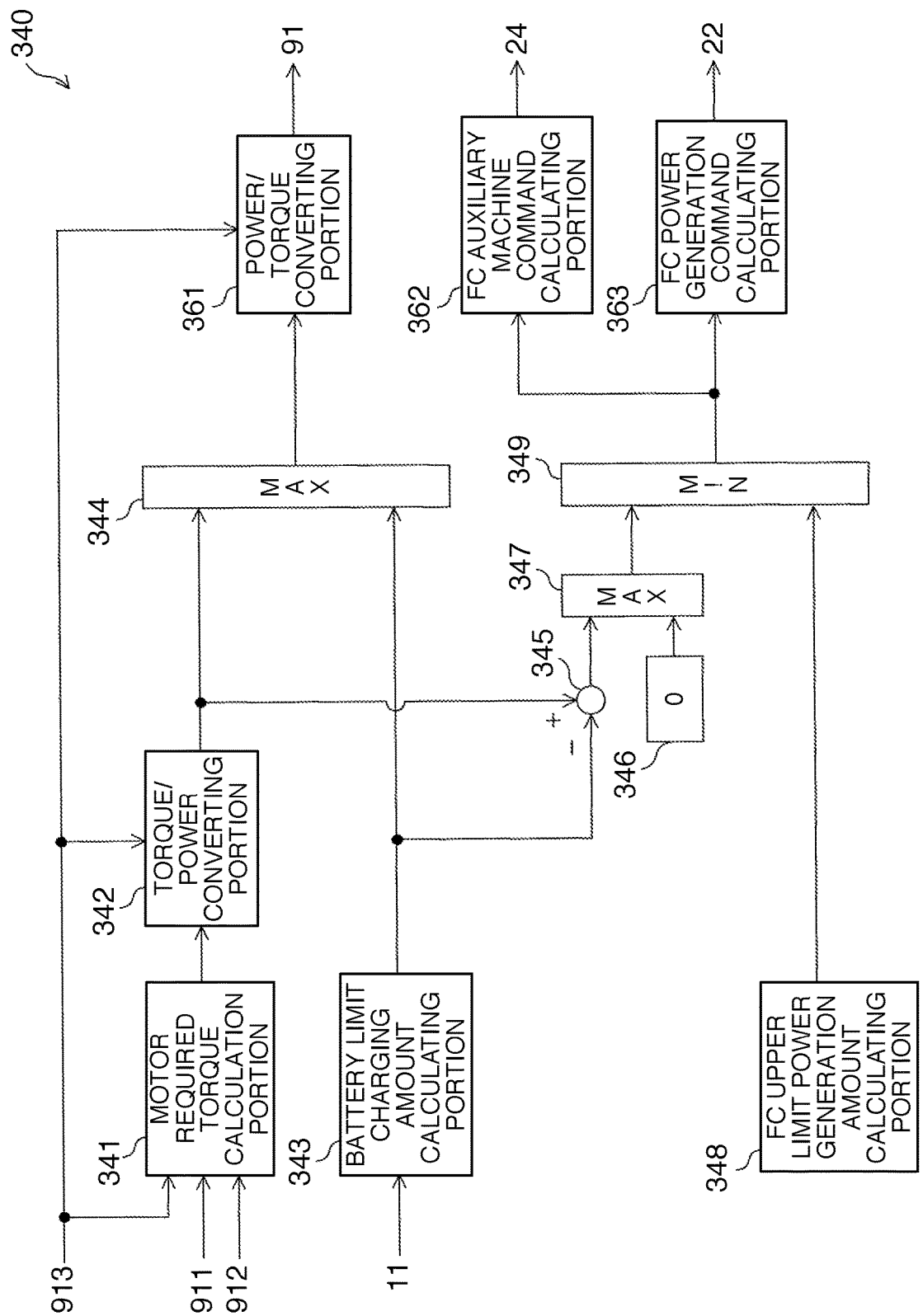
FIG. 8 is a block diagram illustrating a configuration of a battery charging processing portion according to the second embodiment of the present invention.

FIG. 8 is a block diagram illustrating an example of a functional configuration of the battery charging processing portion 340 according to the present embodiment.

The battery charging processing portion 340 includes a motor required torque calculating portion 341, a torque/power converting portion 342, a battery limit charging amount calculating portion 343, a regenerative power setting portion 344, and a power/torque converting portion 361. Further, the battery charging processing portion 340 includes an excessive charging amount calculating portion 345, a lower limit setting portion 346, a chargeable power setting portion 347, an FC upper limit power generation amount calculating portion 348, a generated power setting portion 349, an FC auxiliary machine command calculating portion 362, and an FC power generation command calculating portion 363.

The motor required torque calculating portion 341 calculates a motor required torque necessary for driving the electric motor 92 by use of respective detection values of the accelerator sensor 911, the brake sensor 912, and the vehicle speed sensor 913.

For example, the motor required torque becomes larger than zero as the operation amount of the accelerator pedal increases, and the motor required torque becomes smaller as the vehicle speed increases. When the motor required torque increases and decreases on a positive side as such, the driving force of the electric motor 92 increases and decreases.

As a decrease amount, per unit time, of the operation amount of the accelerator pedal increases or as the operation amount of the brake pedal increases, the motor required torque becomes smaller than zero. When the motor required torque increases on a negative side as such, a regenerative force of the electric motor 92 increases.

In the motor required torque calculating portion 341 of the present embodiment, a predetermined required torque map to be generally used is stored in advance. In the required torque map, a set value of the motor required torque is associated with each operating point specified by the operation amount of the accelerator pedal, the operation amount of the brake pedal, and the vehicle speed.

When the motor required torque calculating portion 341 acquires respective detection values of the accelerator sensor 911, the brake sensor 912, and the vehicle speed sensor 913, the motor required torque calculating portion 341 refers to the required torque map and calculates a set value of the motor required torque that is associated with an operating point specified by those detection values.

Alternatively, the motor required torque calculating portion 341 may calculate the motor required torque by applying respective detection values of the accelerator sensor 911, the brake sensor 912, and the vehicle speed sensor 913 to a predetermined computing equation to be generally used.

Based on the calculation result of the motor required torque calculating portion 341, the torque/power converting portion 342 converts the calculation result into motor required power. The motor required power is a parameter indicative of a magnitude of driving power necessary for driving of the electric motor 92 and a magnitude of regenerative power to be generated by regeneration of the electric motor 92.

Herein, when the electric motor 92 is in the driving state, the motor required power shows a positive value, and when the electric motor 92 is in the regeneration state, the motor required power shows a negative value. For example, as the motor required torque becomes smaller than zero, the motor required power increases on the negative side, namely, a regeneration side. As the detection value of the vehicle speed sensor 913 increases, the motor required power becomes smaller on the regeneration side.

The torque/power converting portion 342 applies the detection result of the motor required torque calculating portion 341 and the detection value of the vehicle speed sensor 913 to a general predetermined computing equation or a predetermined map, so as to calculate motor required power.

In order to avoid overcharge of the battery 10, the battery limit charging amount calculating portion 343 calculates a charge lower limit indicative of a limiting value of the charge power of the battery 10 as illustrated in FIG. 6. In this example, the charge lower limit shows a negative value.

As illustrated in FIG. 2, as the temperature of the battery 10 decreases, the discharge characteristics of the battery 10 decrease, so that an upper limit of the discharge power that is a maximum output of the battery 10 becomes low. Similarly, as the temperature of the battery 10 decreases, the charge characteristics of the battery 10 decrease, so that the charge lower limit of the battery 10 becomes high.

Accordingly, the battery limit charging amount calculating portion 343 according to the present embodiment calculates the charge lower limit of the battery 10 based on the detection value of the temperature sensor 11. For example, in the battery limit charging amount calculating portion 343, a lower limit charging amount map in which a set value of the charge lower limit is associated with each temperature of the battery 10 is stored in advance.

When the battery limit charging amount calculating portion 343 acquires the detection value of the temperature sensor 11, the battery limit charging amount calculating portion 343 refers to the lower limit charging amount map and calculates a set value associated with the detection value of the temperature sensor 11 as the charge lower limit.

Note that, as illustrated in FIG. 2, the charge lower limit of the battery 10 also changes in accordance with a change of the SOC of the battery 10 as well as the temperature of the battery 10. On this account, the battery limit charging amount calculating portion 343 may correct the charge lower limit in accordance with the SOC of the battery 10. For example, the battery limit charging amount calculating portion 343 increases the charge lower limit as the SOC of the battery 10 increases. Further, the detection value of the temperature sensor 11 is used as the temperature of the battery 10, but an estimated value of the temperature of the battery 10 that is provided by the aforementioned temperature specification parameter may be also used.

The regenerative power setting portion 344 sets, as target regenerative power of the electric motor 92, a larger value out of the motor required power from the torque/power converting portion 342 and the charge lower limit from the battery limit charging amount calculating portion 343. The target regenerative power is a parameter indicative of a target value of the regenerative power of the electric motor 92.

The excessive charging amount calculating portion 345 acquires the motor required power from the torque/power converting portion 342 as regenerative power charged to the battery 10 from the electric motor 92. The excessive charging amount calculating portion 345 calculates a surplus chargeable power indicative of an upper limit of chargeable power to the battery 10 other than the regenerative power from the electric motor 92 by subtracting the charge lower limit from the acquired motor required power.

The lower limit setting portion 346 sets "0" as a lower limit of the surplus chargeable power in order to prevent the surplus chargeable power from becoming a value smaller than zero.

The chargeable power setting portion 347 newly sets a larger value out of the surplus chargeable power and its lower limit as the surplus chargeable power.

The FC upper limit power generation amount calculating portion 348 calculates a power generation upper limit indicative of an upper limit of generated power related to the fuel cells 21 so as to avoid performance degradation caused due to excessive power generation of the fuel cells 21. The power generation upper limit may be determined in advance in consideration of experimental data, a simulation result, or the like or may be changed in accordance with the temperature of the fuel cells 21.

The generated power setting portion 349 sets, as target generated power indicative of a target value of the generated power of the fuel cells 21, a smaller value out of the surplus chargeable power of the battery 10 and the power generation upper limit of the fuel cells 21.

The power/torque converting portion 361 converts the target regenerative power into a torque command value of the electric motor 92 based on the target regenerative power from the regenerative power setting portion 344.

The power/torque converting portion 361 of the present embodiment applies the target regenerative power and the detection value of the vehicle speed sensor 913 to a predetermined computing equation or a predetermined map, so as to calculate the torque command value of the electric motor 92. The torque command value increases on a negative side as the target regenerative power increases, and the torque command value decreases on the negative side as the vehicle speed increases. The power/torque converting portion 361 outputs the calculated torque command value to the inverter 91.

The FC auxiliary machine command calculating portion 362 calculates an auxiliary-machine operation command value indicative of a value of operation power necessary for the operation of the FC auxiliary machine 23 based on the target generated power from the generated power setting portion 349. For example, an air volume necessary for power generation of the fuel cells 21 increases as the target generated power increases, so that the auxiliary-machine operation command value becomes larger. The FC auxiliary machine command calculating portion 362 supplies the aforementioned auxiliary-machine operation command value to the auxiliary machine converter 24.

The FC power generation command calculating portion 363 calculates a power generation command value indicative of a value of electric power to be generated by the fuel cells 21 based on the target generated power from the generated power setting portion 349. For example, the power generation command value of the fuel cells 21 increases as the target generated power increases. The FC power generation command calculating portion 363 outputs the power generation command value to the FC converter 22.

In the battery charging processing portion 340, the excessive charging amount calculating portion 345 calculates generated power of the fuel cells 21 that can be charged to the battery 10 other than the regenerative power of the electric motor 92. The power generation amount of the fuel cells 21 can be hereby increased such that electric power is not supplied from the battery 10 to the FC auxiliary machine 23 and electric power to be charged to the battery 10 reaches the charge lower limit.

Figure 9:
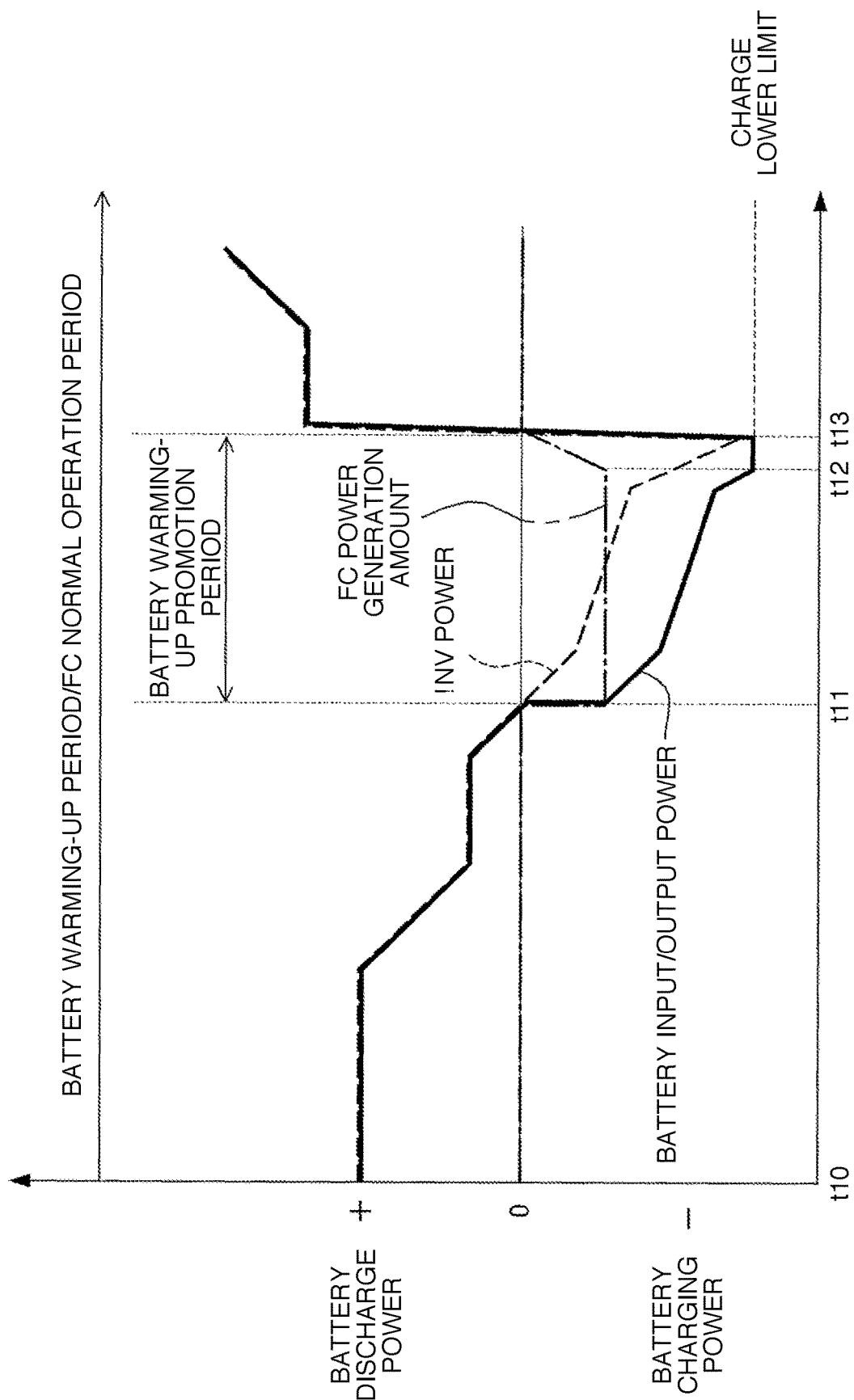
FIG. 9 is a timing chart illustrating a result of controlling charging and discharging of a battery connected to a fuel cell system according to the second embodiment of the present invention.

FIG. 9 is a timing chart illustrating an example of a result of control of the battery 10 and the fuel cells 21 when the battery 10 is shifted to the charging state.

In FIG. 9, an FC power generation amount indicative of a magnitude of generated power of the fuel cells 21 to be charged to the battery 10 is illustrated in addition to the battery input/output power and the INV power illustrated in FIG. 6.

Before a time t10, the warming-up determination portion 310 determines that the temperature Tb of the battery 10 is lower than the warming-up threshold Tt. Further, since the controller 30 executes the starting process of the fuel cell system 20, the temperature of the fuel cells 21 increases to the aforementioned normal operation threshold, so that the warming-up of the fuel cells 21 is finished.

After the warming-up of the fuel cells 21 is finished, the controller 30 controls the FC converter 22 and the auxiliary machine converter 24 such that electric power is supplied from the fuel cells 21 to the FC auxiliary machine 23. Accordingly, the discharging of the battery 10 to the FC auxiliary machine 23 is not performed.

From the time t10 to a time t11, the INV power becomes a positive value due to the driving of the electric motor 92, so that the charging/discharging determination portion 320 determines that the battery 10 is in the discharging state. During this period, the temperature of the fuel cells 21 increases to a specific normal operation threshold, e.g., about 600° C., and the warming-up process of the fuel cells 21 is finished.

At the time t11, the INV power becomes a negative value from zero, so that the charging/discharging determination portion 320 determines that the battery 10 is in the charging state. Accordingly, the battery charging processing portion 340 sets the target generated power for the fuel cells 21 within a range where the target generated power does not exceed the power generation upper limit of the fuel cells 21 in the surplus chargeable power of the battery 10. In the present embodiment, the target generated power is set to the power generation upper limit.

Thereafter, immediately before a time t12, the regenerative power of the electric motor 92 increases along with an increase in the operation amount of the brake pedal, so that a decrease speed of the INV power further increases.

At the time t12, along with the increase in the decrease speed of the INV power, the battery input/output power indicative of the charge power of the battery 10 reaches the charge lower limit. Then, in the battery charging processing portion 340 illustrated in FIG. 8, the surplus chargeable power set by the chargeable power setting portion 347 decreases to be lower than the power generation upper limit, so that the target generated power is set to the surplus chargeable power. Since the surplus chargeable power changes in accordance with a fluctuation of the motor required power, the FC power generation amount decreases as the INV power corresponding to the motor required power decreases, as illustrated in FIG. 9.

At a time t13, the driver steps on the accelerator pedal to accelerate the vehicle again, so that the INV power suddenly changes to a positive value from a negative value.

Thus, the battery charging processing portion 340 charges the battery 10 with the generated power of the fuel cells 21 when the battery 10 is shifted to the charging state. Hereby, the charge power of the battery 10 increases, thereby making it possible to promote the warming-up of the battery 10.

In this example, since the warming-up of the fuel cells 21 is finished, the discharging of the battery 10 to the FC auxiliary machine 23 is not performed in a period from the time t10 to the time t11 in which the battery 10 is in the discharging state, and in a period after the time t13. However, when the battery 10 is in the discharging state as illustrated in FIG. 6, the discharging of the battery 10 to the FC auxiliary machine 23 may be performed. Accordingly, it is possible to promote the warming-up of the battery 10.

Further, when the battery input/output power reaches the charge lower limit at the time t12, the FC power generation amount is reduced in accordance with the INV power. However, the battery charging processing portion 340 may stop the power generation of the fuel cells 21 so that the FC generated power becomes zero when the battery input/output power reaches the charge lower limit. This makes it possible to restrain such a situation that the battery input/output power exceeds the charge lower limit due to a steep change of the INV power.

According to the second embodiment of the present invention, as illustrated in FIG. 9, when the warming-up of the fuel cells 21 has been finished at the time when it is determined that the battery 10 is in the charging state, the battery charging processing portion 340 charges the battery 10 by use of the generated power of the fuel cells 21. Accordingly, when the battery 10 is shifted to the charging state, the current flowing through the battery 10 increases, so that the warming-up of the battery 10 can be promoted.

Further, according to the present embodiment, the battery limit charging amount calculating portion 343 illustrated in FIG. 8 finds a limiting value of the charge power of the battery 10 based on the temperature of the battery 10. The generated power setting portion 349 reduces or stops the generated power of the fuel cells 21 by use of the chargeable power setting portion 347 so that the charge power of the battery 10 does not exceed the limiting value. Accordingly, it becomes possible to prevent the charge power of the battery 10 from exceeding the limiting value, thereby suppressing deterioration of the battery 10 due to overcharge of the battery 10.

Third Embodiment

Figure 10:
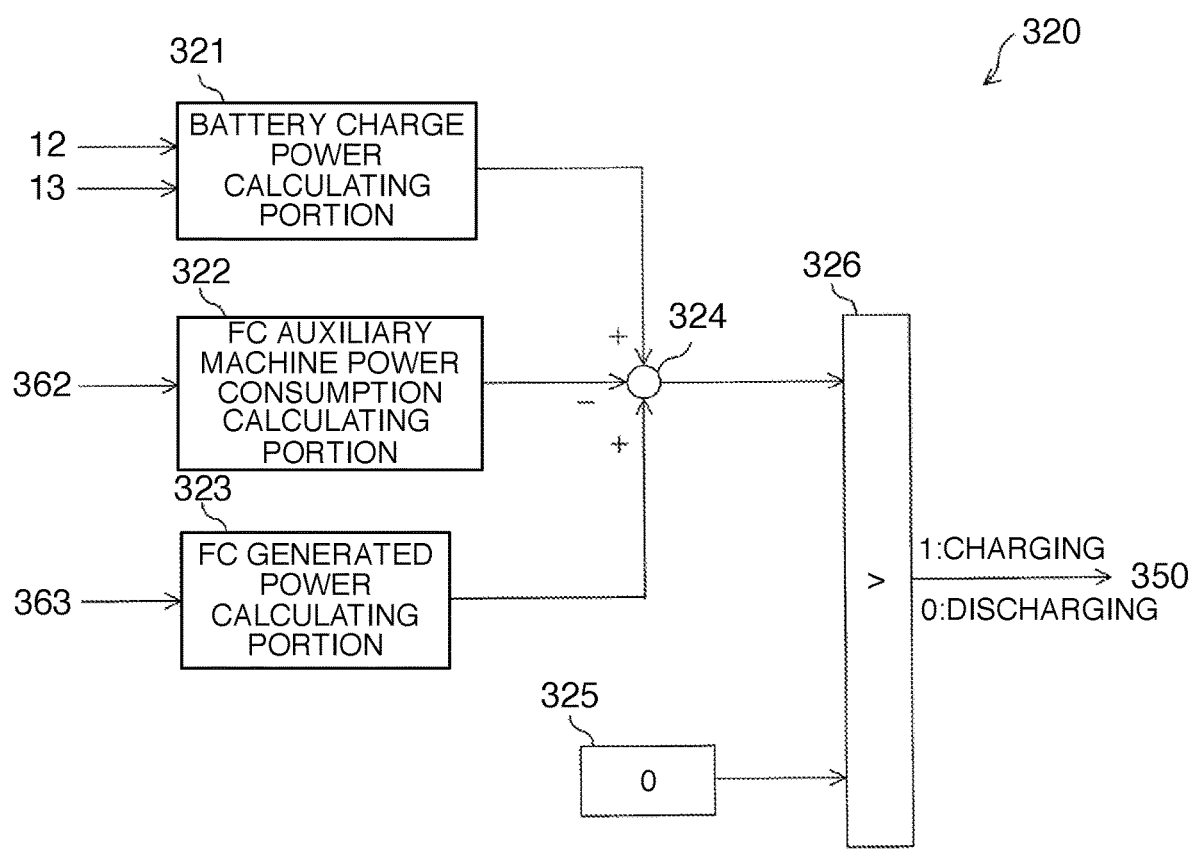
FIG. 10 is a block diagram illustrating a configuration of a battery charging/discharging determination portion constituting a controller according to a third embodiment of the present invention.

FIG. 10 is a block diagram illustrating an example of a functional configuration of the charging/discharging determination portion 320 according to the third embodiment of the present invention.

The charging/discharging determination portion 320 according to the present embodiment includes a battery charge power calculating portion 321, an FC auxiliary machine power consumption calculating portion 322, an FC generated power calculating portion 323, a calculating portion 324, a threshold setting portion 325, and a comparing portion 326.

The battery charge power calculating portion 321 calculates charge power of the battery 10 based on respective detection values of the current sensor 12 and the voltage sensor 13 of the battery 10. A calculated value of the charge power shows a positive value when the battery 10 is in the charging state. More specifically, the battery charge power calculating portion 321 calculates the charge power of the battery 10 by multiplying the detection value of the current sensor 12 by the detection value of the voltage sensor 13.

The FC auxiliary machine power consumption calculating portion 322 calculates a power consumption of the FC auxiliary machine 23 based on an auxiliary-machine operation command value from the FC auxiliary machine command calculating portion 362. For example, when the auxiliary-machine operation command value is a torque command value of the compressor, the FC auxiliary machine power consumption calculating portion 322 calculates the power consumption of the FC auxiliary machine 23 by use of the torque command value of the compressor and the rotation speed of the compressor.

Alternatively, in a case where a heater to warm up the fuel cells 21 is provided in the FC auxiliary machine 23, the FC auxiliary machine power consumption calculating portion 322 may calculate a value obtained by adding an output of the heater to a power consumption of the compressor as the power consumption of the FC auxiliary machine 23.

The FC generated power calculating portion 323 calculates the power generated of the fuel cells 21 based on the power generation command value from the FC power generation command calculating portion 363. For example, in a case where the power generation command value indicates a fuel-cell side voltage value of the FC converter 22 that is necessary to obtain the target generated power of the fuel cells 21, the FC generated power calculating portion 323 calculates the generated power of the fuel cells 21 from the fuel-cell side voltage.

Note that the FC generated power calculating portion 323 may acquire the target generated power from the generated power setting portion 349 illustrated in FIG. 8 and output the acquired value to the calculating portion 324.

The calculating portion 324 calculates a power consumption of the fuel cell system 20 by subtracting the power consumption acquired from the FC auxiliary machine power consumption calculating portion 322 from the generated power of the fuel cells 21 that is acquired from the FC generated power calculating portion 323. Then, the calculating portion 324 adds the power consumption of the fuel cell system 20 and the charge power acquired from the battery charge power calculating portion 321.

The threshold setting portion 325 sets "0" as a determination threshold based on which it is determined whether or not the charge power of the battery 10 exceeds the power consumption of the fuel cell system 20.

The comparing portion 326 compares the calculation result of the calculating portion 324 with the determination threshold. That is, the comparing portion 326 determines whether or not the charge power of the battery 10 exceeds the power consumption of the fuel cell system 20.

When the charge power of the battery 10 exceeds the power consumption of the fuel cell system 20, the comparing portion 326 determines that the battery 10 is shifted to the charging state and outputs "1" as a determination result. In contrast, when the charge power of the battery 10 is equal to or less than the power consumption of the fuel cell system 20, the comparing portion 326 determines that the battery 10 is not shifted to the charging state and outputs "0" as a determination result.

As such, when the charging/discharging determination portion 320 compares the detection value of the charge power of the battery 10 with a predicted value of the power consumption of the fuel cell system 20, it is possible to determine in advance whether the battery 10 is shifted to the charging state or not.

Note that the comparing portion 326 may have hysteresis so that a determination result does not change frequently in a short time in a case where the calculation result of the calculating portion 324 fluctuates around zero.

In the third embodiment of the present invention, as illustrated in FIG. 10, the charging/discharging determination portion 320 calculates the charge power of the battery 10 by use of the detection value of the current of the battery 10 and the detection value of the voltage of the battery 10. Further, the charging/discharging determination portion 320 calculates the power consumption of the fuel cell system 20 by use of the generation command value of the fuel cells 21 and the operation command value of the FC auxiliary machine 23. When the charge power of the battery 10 exceeds the power consumption of the fuel cell system 20, the charging/discharging determination portion 320 determines that the battery 10 is in the charging state.

If the charging/discharging determination portion 320 monitors only the detection value of the charge power of the battery 10, the INV power reaches "0," but the battery input/output power does not reach "0" at the time t1 in FIG. 6. Accordingly, it is not determined that the battery 10 is in the charging state. As a result, the supply of the FC auxiliary machine power by the discharging of the battery 10 is not stopped.

Since the battery input/output power gradually decreases in accordance with a decrease in the INV power, so that, during a period from the time t1 until the battery input/output power reaches "0," the supply of the FC auxiliary machine power continues due to the discharging of the battery 10.

In contrast, according to the present embodiment, the charging/discharging determination portion 320 compares the detection value of the charge power of the battery 10 with the predicted value of the power consumption based on the command value of the fuel cell system 20, so that it is possible to precisely determine that the battery 10 is shifted to the charging state. This makes it possible to suppress disturbance of the warming-up of the battery 10, by discharging the battery 10 to the FC auxiliary machine 23 even though the electric motor 92 is in the regeneration state.

The embodiments of the present invention have been described above, but the embodiments just show some applications of the present invention and are not intended to limit the technical scope of the present invention to the concrete configurations of the embodiments.

For example, in the above embodiments, a blower or a compressor that supplies the air to the fuel cells 21 is employed as the FC auxiliary machine 23, but the present invention is not limited to this. For example, the FC auxiliary machine 23 may be a blower that supplies ethanol or the like used for power generation of solid oxide fuel cells or may be a pump that supplies refrigerant to the fuel cells 21. Even with such a device, it is possible to obtain the same effect as the above embodiments.

Note that the above embodiments can be combined appropriately.

The invention claimed is:

1. A control method for an electric power supply system comprising a fuel cell system provided with an auxiliary machine that causes solid oxide fuel cells to generate an electric power, and a battery that generates heat through discharging and charging, the electric power supply system being configured to supply the electric power to an electric load having a function of supplying the electric power to the battery, the method comprising:
 a determining step of determining an operation state of the battery;
 a discharging step of supplying the electric power to the auxiliary machine of the fuel cell system by discharging the battery, when a temperature of the battery is determined in the determining step to be equal to or less than a predetermined temperature which is set lower than a temperature required for the fuel cells to generate the electric power; and
 a charging control step of reducing or stopping the electric power supplied to the auxiliary machine in the discharging step, when the battery is determined in the determining step to be in a charging state using the electric power supplied from at least the electric load.

2. The control method according to claim 1, wherein:
 the system further comprises an auxiliary battery connected to the auxiliary machine; and
 when the battery is determined to be in the charging state in the determining step, the charging control step causes the auxiliary battery to supply the electric power to the auxiliary machine to operate the auxiliary machine.

3. The control method according to claim 2, wherein:
 the system further comprises a converter placed between the battery and the auxiliary machine and capable of lowering a voltage of the electric power supplied to the auxiliary machine from an output voltage of the battery; and
 when the battery is determined to be in the charging state in the determining step, the charging control step causes the converter to lower the voltage or stop the electric power supplied from the converter to the auxiliary machine.

4. The control method according to claim 1, wherein when the battery is determined to be in the charging state in the determining step, the charging control step supplies the electric power from the fuel cells to the auxiliary machine to operate the auxiliary machine.

5. The control method according to claim 1, wherein when the battery is determined to be in the charging state in the determining step, the charging control step supplies the electric power from the battery to the auxiliary machine to operate the auxiliary machine.

6. The control method according to claim 1, wherein when warming-up of the fuel cells has been finished at the time when the battery is determined to be in the charging state in the determining step, the charging control step charges the battery using the electric power generated by the fuel cells.

7. The control method according to claim 6, wherein the charging control step finds a limiting value of charge power of the battery based on a temperature of the battery, and reduces or stops the electric power generated by the fuel cells such that the charge power of the battery does not exceed the limiting value.

8. The control method according to claim 1, wherein:
 the electric load includes an electric motor having a driving state and a regeneration state; and
 when the electric motor is shifted to the regeneration state, the determining step determines that the battery is in the charging state.

9. The control method according to claim 1, wherein the determining step detects a current of the battery, and when a sign of the current denotes a charge current of the battery, the determining step determines that the battery is in the charging state.

10. The control method according to claim 1, wherein the determining step calculates charge power of the battery based on respective detection values of a current and a voltage of the battery and calculates power consumption of the fuel cell system based on a power generation command value of the fuel cells and an operation command value of the auxiliary machine, and the determining step determines that the battery is in the charging state when the charge power of the battery exceeds the power consumption of the fuel cell system.

11. The control method according to claim 1, wherein:
 the fuel cells are solid oxide fuel cells; and
 the control method further comprises a warming-up step of warming up the solid oxide fuel cells when the fuel cell system starts operation.

12. The control method according to claim 11, wherein the warming-up step finishes the warming-up of the fuel cells, when the temperature of the fuel cells reaches a particular temperature or higher.

13. An electric power supply system comprising a fuel cell system provided with an auxiliary machine configured to operate such that solid oxide fuel cells generate an electric power, and a battery, the electric power supply system being configured to supply the electric power to an electric load having a function of supplying the electric power to the battery, the system comprising:
 a converter placed between the battery and the auxiliary machine; and
 a controller configured to:
  adjust an output power from the converter to the auxiliary machine to an operation power by which the auxiliary machine can operate, when a temperature of the battery is equal to or less than a predetermined temperature which is set lower than a temperature required for the fuel cells to generate the electric power,
 wherein the controller is further configured to set the output power from the converter to a value smaller than the operation power, when the battery is determined to be in a charging state using the electric power supplied from at least the electric load.

* * * * *